(12) United States Patent
Yamada et al.

(10) Patent No.: US 11,749,731 B2
(45) Date of Patent: Sep. 5, 2023

(54) SEMICONDUCTOR DEVICE

(71) Applicant: DENSO CORPORATION, Kariya (JP)

(72) Inventors: Susumu Yamada, Kariya (JP); Satoru Sugita, Kariya (JP); Kenji Komiya, Kariya (JP)

(73) Assignee: DENSO CORPORATION, Kariya (JP)

( * ) Notice: Subject to any disclaimer, the term of this patent is extended or adjusted under 35 U.S.C. 154(b) by 223 days.

(21) Appl. No.: 17/394,278

(22) Filed: Aug. 4, 2021

(65) Prior Publication Data

US 2021/0367048 A1 Nov. 25, 2021

Related U.S. Application Data

(63) Continuation of application No. PCT/JP2020/000817, filed on Jan. 14, 2020.

(30) Foreign Application Priority Data

Feb. 13, 2019 (JP) .................................. 2019-023694

(51) Int. Cl.
*H01L 29/417* (2006.01)
*H01L 29/423* (2006.01)
(Continued)

(52) U.S. Cl.
CPC .... *H01L 29/41775* (2013.01); *H01L 29/4238* (2013.01); *H01L 23/34* (2013.01);
(Continued)

(58) Field of Classification Search
CPC ........... H01L 29/41775; H01L 29/4238; H01L 29/41741; H01L 23/34; H01L 23/4951; H01L 23/49562; H01L 23/49568
See application file for complete search history.

(56) References Cited

U.S. PATENT DOCUMENTS 9,620,440 B1 * 4/2017 Shibuya .............. H01L 21/4828
2004/0016979 A1 1/2004 Kawano et al.
(Continued)

FOREIGN PATENT DOCUMENTS

JP 2013-045973 A 3/2013
JP 2016-167527 A 9/2016

*Primary Examiner* — Marc Anthony Armand
(74) *Attorney, Agent, or Firm* — POSZ LAW GROUP, PLC

(57) ABSTRACT

A semiconductor device includes a semiconductor chip, first and second conductive members disposed on opposite sides of the semiconductor chip. The semiconductor chip includes a semiconductor substrate, a surface electrode and gate wirings. The semiconductor substrate has active regions formed with elements, and an inactive region not formed with an element. The inactive region includes an inter-inactive portion disposed between at least two active regions and an outer peripheral inactive portion disposed on an outer periphery of the at least two active regions. The surface electrode is disposed to continuously extend above the at least two active regions and the inter-inactive portion. The gate wirings are disposed above the inactive region, and include a first gate wiring disposed on an outer periphery of the surface electrode, and a second gate electrode disposed at a position facing the surface electrode.

18 Claims, 7 Drawing Sheets

(51) Int. Cl.
*H01L 23/34* (2006.01)
*H01L 23/495* (2006.01)
*H01L 23/00* (2006.01)
*H01L 29/06* (2006.01)

(52) U.S. Cl.
CPC .... *H01L 23/4951* (2013.01); *H01L 23/49562* (2013.01); *H01L 23/49568* (2013.01); *H01L 24/33* (2013.01); *H01L 24/73* (2013.01); *H01L 29/0696* (2013.01); *H01L 29/41741* (2013.01); *H01L 2224/33181* (2013.01); *H01L 2224/73215* (2013.01); *H01L 2224/73265* (2013.01); *H01L 2924/10253* (2013.01); *H01L 2924/10272* (2013.01)

(56) References Cited

U.S. PATENT DOCUMENTS

| | | |
|---|---|---|
| 2013/0049137 A1 | 2/2013 | Uno et al. |
| 2016/0027711 A1* | 1/2016 | Harada .............. H01L 23/49827 257/698 |
| 2016/0126156 A1 | 5/2016 | Osaga et al. |
| 2018/0158762 A1 | 6/2018 | Tonedachi |

\* cited by examiner

SEMICONDUCTOR DEVICE

CROSS REFERENCE TO RELATED APPLICATIONS

The present application is a continuation application of International Patent Application No. PCT/JP2020/000817 filed on Jan. 14, 2020, which designated the U.S. and claims the benefit of priority from Japanese Patent Application No. 2019-023694 filed on Feb. 13, 2019. The entire disclosures of all of the above applications are incorporated herein by reference.

TECHNICAL FIELD

The present disclosure relates to a semiconductor device.

BACKGROUND

For example, a semiconductor device has a semiconductor substrate, and the semiconductor substrate is formed with a plurality of active regions and an inactive region.

SUMMARY

The present disclosure describes a semiconductor device including a semiconductor chip, a first conductive member disposed on a back surface side of the semiconductor chip and a second conductive member disposed on a front surface side of the semiconductor chip, and being capable of improving electrical performance. The semiconductor chip includes a semiconductor substrate, a surface electrode, and gate wirings. The semiconductor substrate has a plurality of active regions formed with elements, and an inactive region not formed with an element. The surface electrode is disposed to continuously extend above at least two adjacent active regions and above an inter-inactive portion of the inactive region, which is located between the at least two active regions. The gate wirings are disposed above the inactive region on the front surface side, and include a first gate wiring disposed on a periphery of the surface electrode, and a second gate wiring disposed at a position facing the surface electrode.

BRIEF DESCRIPTION OF DRAWINGS

Features and advantages of the present disclosure will become more apparent from the following detailed description made with reference to the accompanying drawings, in which.

DETAILED DESCRIPTION

Figure 1:
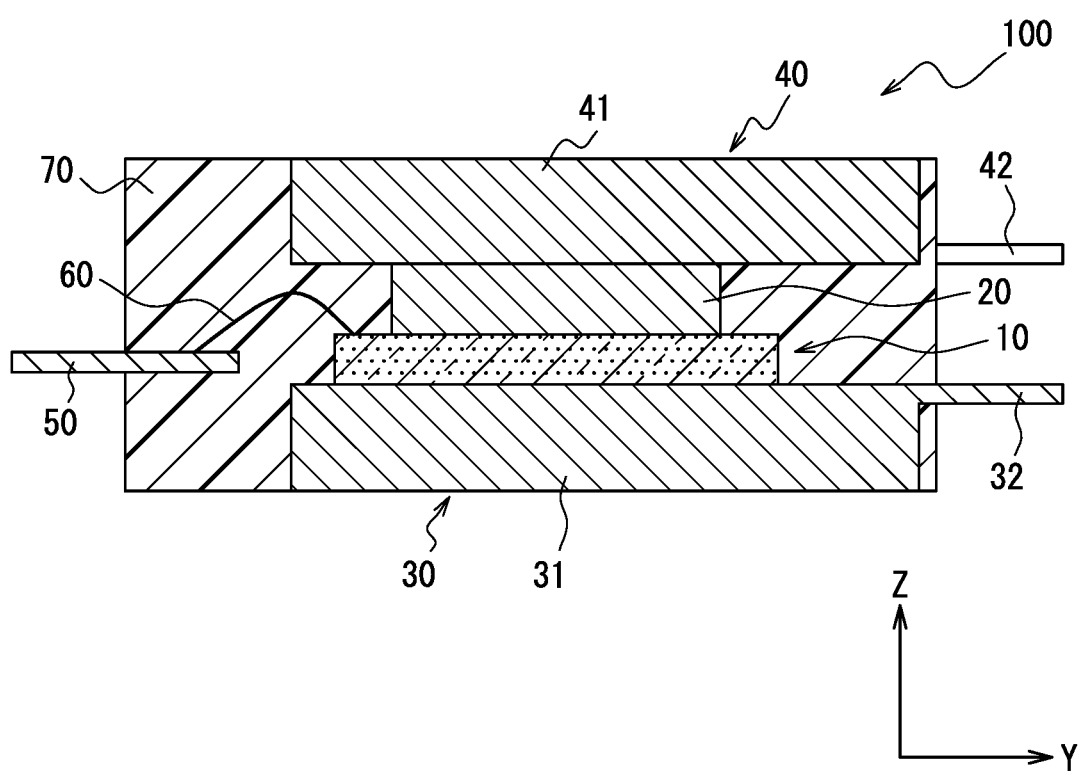
FIG. 1 is a cross-sectional view of a semiconductor device for showing a schematic configuration according to an embodiment.

In a semiconductor device having a semiconductor substrate in which a plurality of active regions and an inactive region are formed, for example, a gate wiring may be formed on the inactive region, and surface electrodes may be connected to the active regions disposed on both sides of the inactive region. In such a configuration, if the surface electrode slides, a short-circuit with the gate wiring is likely to occur. In the semiconductor device, if the surface electrode and the gate wiring are short-circuited, the electrical characteristics will be degraded.

According to an aspect of the present disclosure, a semiconductor device includes a semiconductor chip, a first conductive member disposed adjacent to a back surface of the semiconductor chip, and a second conductive member disposed adjacent to a front surface of the semiconductor chip opposite to the back surface. The semiconductor chip includes a semiconductor substrate, a surface electrode, and gate wirings. The semiconductor substrate has a plurality of active regions in which elements are formed, and an inactive region in which an element is not formed. The inactive region includes an inter-inactive portion that is disposed between at least two adjacent active regions, and an outer peripheral inactive portion disposed on a periphery of the at least two adjacent active regions. The surface electrode is disposed to extend continuously above the at least two adjacent active regions and above the inter-inactive portion disposed between the at least two adjacent active regions. The gate wirings are disposed above the inactive region adjacent to the front surface of the semiconductor chip. The gate wirings include a first gate wiring disposed on an outer periphery of the surface electrode, and a second gate wiring disposed at a position facing the surface electrode.

In such a configuration, the surface electrode is provided so as to straddle the second gate wiring. Therefore, it is less likely that the surface electrode will slide on the second gate wiring, as compared with the case where the surface electrode is divided above the gate wiring. As such, it is less likely that the surface electrode will short-circuit with the second gate wiring.

Hereinafter, embodiments for implementing the present disclosure will be described with reference to the drawings. In each embodiment, portions corresponding to those described in the preceding embodiment are denoted by the same reference numerals, and descriptions thereof will not be repeated. In each of the embodiments, when only a part of the configuration is described, the other part of the embodiment can be referred to those described in the preceding embodiment. Hereinafter, three directions perpendicular to each other are defined as an X direction, a Y direction, and a Z direction.

As shown in FIG. 1, the semiconductor device 100 includes a semiconductor chip 10, a terminal part 20, heat sinks 31, 41, main terminals 32, 42, a signal terminal 50, a wire 60, and a sealing resin part 70. Such a semiconductor device 100 is known as a so-called 1-in-1 package that constitutes one of the six arms of a three-phase inverter, and is incorporated into, for example, an inverter circuit of a vehicle.

A first heat sink 31 provides a part of a first terminal member 30. The first terminal member 30 includes the first heat sink 31 and a first main terminal 32. The first heat sink 31 and the first main terminal 32 form an integral body. Specifically, the first terminal member 30 includes the first main terminal 32 and the first heat sink 31. The first heat sink 31 is thicker in the Z direction than the first main terminal 32. The first terminal member 30 is disposed adjacent to a back surface of the semiconductor chip 10. The first terminal member 30 corresponds to a first conductive member.

The first terminal member 30 is made mainly of a metal, such as aluminum or copper, having excellent thermal conductivity and electrical conductivity. That is, the first terminal member 30 is used as a heat radiating member as well as an electrical conduction path. Therefore, it can be said that the first terminal member 30 is mainly made of metal in order to secure thermal conductivity and electrical conductivity. Alternatively, the first terminal member 30 may be made of an alloy containing a metal having excellent thermal conductivity and electrical conductivity.

Figure 2:
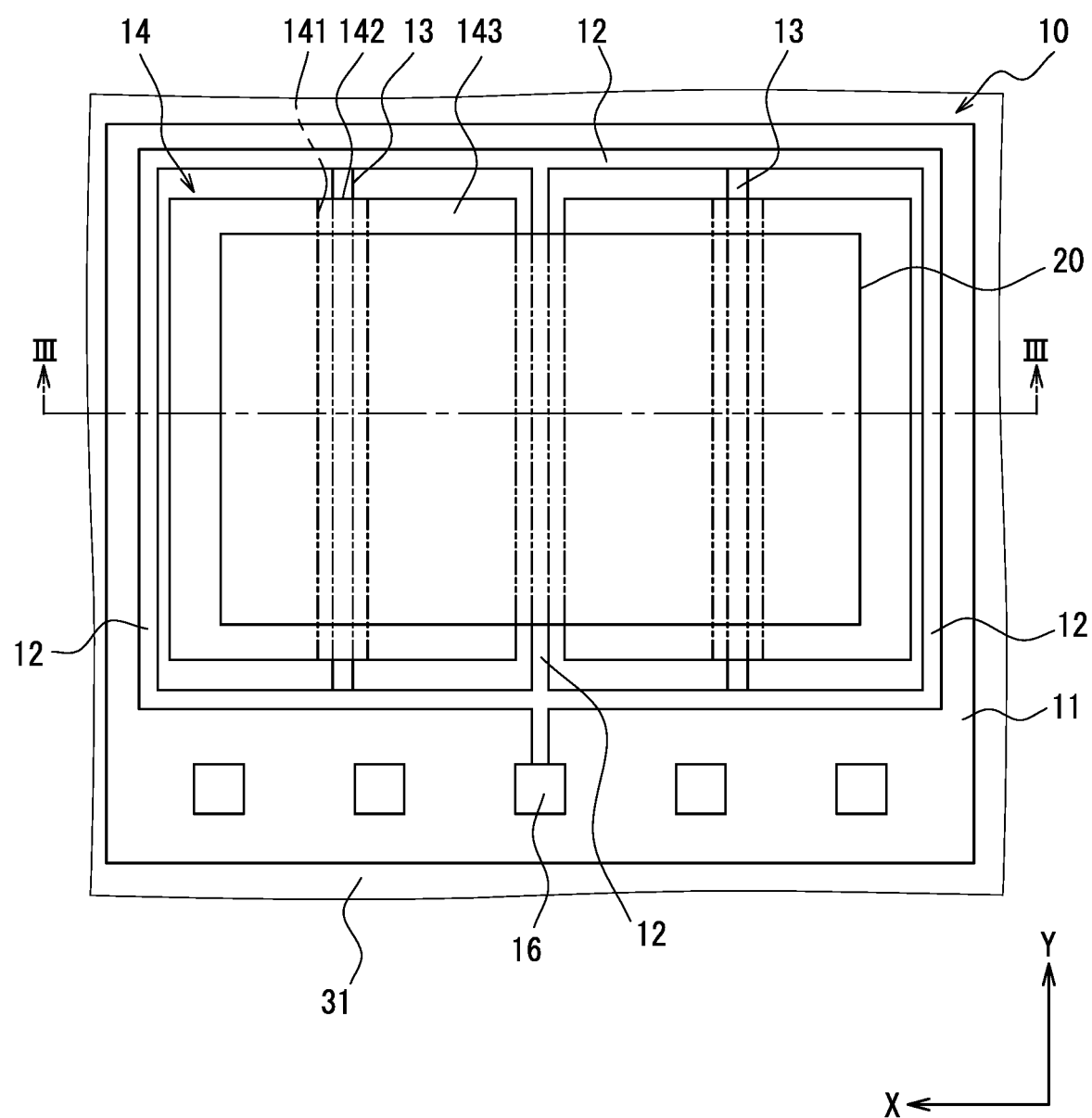
FIG. 2 is a plan view of a semiconductor chip of the semiconductor device for showing a schematic configuration according to the embodiment.
Figure 3:
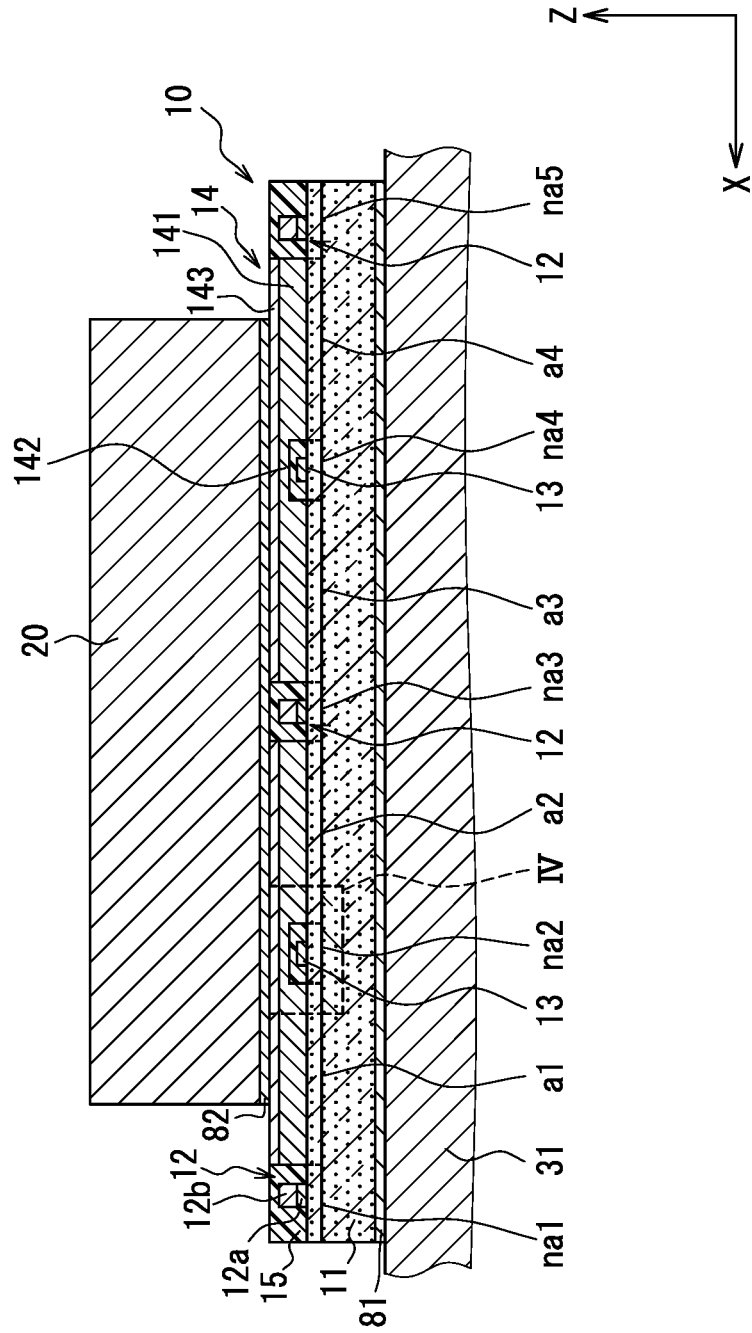
FIG. 3 is a cross-sectional view taken along a line III-III in FIG. 2.

The first heat sink 31 is a part for dissipating heat generated from the semiconductor chip 10. Specifically, the first heat sink 31 is provided for dissipating heat generated from a power transistor formed in a semiconductor substrate 11. The first heat sink 31 corresponds to a first heat radiating part. As shown in FIGS. 1 and 3, the first heat sink 31 is connected to an electrode (for example, a drain electrode) formed on the back surface of the semiconductor chip 10 via a first connecting portion 81. Therefore, the first heat sink 31 is electrically and mechanically connected to the semiconductor chip 10. The first connecting portion 81 may be provided by a conductive connecting material such as solder. In FIGS. 2 and 3, a second terminal member 40 and the sealing resin part 70 are not shown for the sake of clear view of the drawing.

As shown in FIG. 1, in the first heat sink 31, the surface opposite to the surface facing the semiconductor chip 10 is exposed from the back surface of the sealing resin part 70 to serve as a heat radiating surface. In the present embodiment, the back surface of the sealing resin part 70 and the heat radiating surface of the first heat sink 31 are substantially coplanar with each other.

In the semiconductor device 100, therefore, the heat generated from the semiconductor chip 10 is transferred to the first heat sink 31 and radiated from the heat radiating surface of the first heat sink 31. As such, even if the semiconductor chip 10 generates heat, the semiconductor device 100 can suppress damage or problems to the semiconductor chip 10 due to the heat.

The facing surface of the first heat sink 31 facing the semiconductor chip 10 and the lateral surface connecting the facing surface and the heat radiating surface are covered with the sealing resin part 70. That is, the first heat sink 31 is covered with the sealing resin part 70 in a state where the surface facing the semiconductor chip 10 and the lateral surface are in contact with the sealing resin part 70. The facing surface of the first heat sink 31 facing the semiconductor chip 10 is covered with the sealing resin part 70 around the region where the first connecting portion 81 is provided.

As shown in FIG. 1, the first main terminal 32 connects to the first heat sink 31. The first main terminal 32 is a portion protruding from the first heat sink 31. The first main terminal 32 is electrically connected to the drain electrode of the semiconductor chip 10 via the first heat sink 31. Therefore, it can be said that the first heat sink 31 has a function as an electrical conduction path in addition to a function as the heat radiating member. In other words, the first heat sink 31 functions to electrically interconnect the drain electrode and the first main terminal 32 to each other.

The first main terminal 32 extends from the first heat sink 31 in the Y direction. That is, the first main terminal 32 extends from the first heat sink 31 on the same side as a second main terminal 42, which will be described later. The first main terminal 32 projects to the outside of the sealing resin part 70 from the same lateral surface of the sealing resin part 70 as the second main terminal 42. In other words, a part of the first main terminal 32 is covered with the sealing resin part 70, and the other part projects from the sealing resin part 70.

The first terminal member 30 of the present disclosure is not limited to have the configuration described above. The first heat sink 31 and the first main terminal 32 may be provided by separate members, and be connected to each other with an electrically conductive connection member. In such a case, the first heat sink 31 can be regarded as the first conductive member.

The terminal part 20 and the second terminal member 40 are provided on a front surface side of the semiconductor chip 10. In other words, the terminal part 20 and the second terminal member 40 are disposed adjacent to a front surface of the semiconductor chip 10. The terminal part 20 and the second terminal member 40 correspond to a second conductive member. The terminal part 20 and the second terminal member 40 are mainly made of a metal, such as aluminum or copper, having excellent thermal conductivity and electrical conductivity. That is, since the terminal part 20 and the second terminal member 40 are used as a heat radiating member and an electric conduction path, the terminal part 20 and the second terminal member 40 are mainly made of a metal in order to secure thermal conductivity and electrical conductivity. Alternatively, the terminal part 20 and the second terminal member 40 may be made of an alloy containing a metal having excellent thermal conductivity and electrical conductivity.

As shown in FIG. 1, the terminal part 20 is interposed between the semiconductor chip 10 and the second heat sink 41. The terminal part 20 is provided to restrict the wire 60, which will be described later, from coming into contact with the second heat sink 41. The terminal part 20 is located in a middle of the heat conduction path and electrical conduction path, between the semiconductor chip 10 and the second heat sink 41. The terminal part 20 has a substantially prismatic shape. For example, the terminal part 20 has a substantially rectangular parallelepiped shape. In such a case, the surface of the terminal part 20 facing the electrode 14 and the surface of the terminal part 20 facing the second heat sink 41 are flat surfaces. In the present embodiment, a single block-shaped terminal part 20 is used, as an example. In other words, the terminal part 20 has a plate shape.

As shown in FIG. 3, the terminal part 20 is arranged so as to face the electrode 14 on the front surface of the semiconductor chip 10. The electrode 14 is, for example, a source electrode. The terminal part 20 is electrically and mechanically connected to the electrode 14 through a second connecting portion 82. The second connecting portion 82 can employ a conductive connecting member such as solder.

Further, as shown in FIG. 2, the terminal part 20 has a rectangular shape in the XY plane, that is, when viewed in a direction orthogonal to the XY plane. The terminal part 20 is provided to extend over two electrodes 14. Further, as shown in FIG. 3, the terminal part 20 is provided so as to face a plurality of active regions a1 to a4 of the semiconductor substrate 11. Therefore, as shown in FIG. 3, the terminal part 20 is arranged not only above the plurality of active regions a1 to a4 but also above inactive regions na2 to na4 of the semiconductor substrate 11. For example, the terminal part 20 is connected to a part of each electrode 14 on the front surface of the semiconductor chip 10, not to the entire area of each electrode 14. Alternatively, the terminal part 20 may be connected to the entire area of each electrode 14.

The second heat sink 41 is a part of the second terminal member 40. The second terminal member 40 is provided by an integral body of the second heat sink 41 and the second main terminal 42. Specifically, the second terminal member 40 includes the second main terminal 42 and the second heat sink 41, which is thicker in the Z direction than the second main terminal 42. The second terminal member 40 is provided on the front surface of the semiconductor chip 10 via the terminal part 20.

The second heat sink 41 is a part for dissipating heat generated from the semiconductor chip 10. Specifically, the second heat sink 41 is provided to dissipate heat generated from a power transistor formed in the semiconductor substrate 11. The second heat sink 41 corresponds to the second heat radiating part. As shown in FIGS. 1 and 3, the second heat sink 41 is electrically and mechanically connected to the terminal part 20 via a conductive connecting member such as solder. That is, the second heat sink 41 is connected to the electrode 14 via a second connecting portion 82, the terminal part 20, and the like. In other words, the terminal part 20 electrically connects the second heat sink 41 and the electrode 14. In this way, the second heat sink 41 is electrically connected to the semiconductor chip 10.

Further, as shown in FIG. 1, the surface of the second heat sink 41 opposite to the surface facing the semiconductor chip 10 is exposed from a front surface of the sealing resin part 70 to serve as a heat radiating surface. In the present embodiment, the front surface of the sealing resin part 70 and the heat radiating surface of the second heat sink 41 are substantially coplanar with each other.

In the semiconductor device 100, therefore, the heat generated from the semiconductor chip 10 is transferred to the second heat sink 41 and radiated from the heat radiating surface of the second heat sink 41. In this way, even if the semiconductor chip 10 generates heat, damage or problems to the semiconductor device 100 due to the heat can be suppressed.

The surface of the second heat sink 41 facing the terminal part 20 and the lateral surface of the second heat sink 41 connecting the facing surface and the heat radiating surface are covered with the sealing resin part 70. That is, the second heat sink 41 is covered with the sealing resin part 70 in a state where the surface facing the terminal part 20 and the lateral surface are in contact with the sealing resin part 70. The surface of the second heat sink 41 facing the terminal part 20 is covered with the sealing resin part 70 in a region around the region where the connecting member is provided.

The second main terminal 42 connects to the second heat sink 41. The second main terminal 42 is a portion protruding from the second heat sink 41. The second main terminal 42 projects outside of the sealing resin part 70 from the same lateral surface as the first main terminal 32. The second main terminal 42 is electrically connected to the electrode 14 of the semiconductor chip 10 via the second heat sink 41. As such, the second heat sink 41 has a function as a heat radiating part and a function as an electrical conduction path. In other words, the second heat sink 41 functions to electrically interconnect the electrode 14 and the second main terminal 42.

The second terminal member 40 of the present disclosure is not limited to have the configuration described above. For example, the second heat sink 41 and the second main terminal 42 may be provided by separate members, and connected to each other with an electrically conductive connecting member. In such a case, the second heat sink 41 can also be regarded as the second conductive member.

The terminal part 20 can be made of the same material as both the heat sinks 31 and 41. In this case, the semiconductor device 100 can secure thermal conductivity and electrical conductivity on the front surface side and the back surface side of the semiconductor chip 10.

Further, the terminal part 20 may have a different coefficient of linear expansion from the heat sinks 31 and 41 and the semiconductor substrate 11. In this case, the coefficient of linear expansion $\alpha 1$ of the terminal part 20 is preferably a value between the coefficient of linear expansion $\alpha 2$ of both the heat sinks 31 and 41 and the coefficient of linear expansion $\alpha 3$ of the semiconductor substrate 11. Specifically, the relationship between these linear expansion coefficients is preferably $\alpha 3 < \alpha 1 < \alpha 2$. In such a case, the semiconductor device 100 can suppress warpage due to the difference in the coefficient of linear expansion of the terminal part 20, both the heat sinks 31, 41, and the semiconductor substrate 11. Further, the semiconductor device 100 can suppress the stress applied to the semiconductor substrate 11, the stress applied to a connection portion between the semiconductor chip 10 and the first heat sink 31, and the stress applied to a connection portion between the semiconductor chip 10 and the terminal part 20.

As shown in FIG. 1, the signal terminal 50 is electrically connected to the pad 16 via a wire 60. The wire 60 is connected to the signal terminal 50 and the pad 16 by, for example, bonding. A part of the signal terminal 50 is covered with the sealing resin part 70, and a remaining part of the signal terminal 50 projects from the sealing resin part 70. The signal terminal 50 projects outside of the sealing resin part 70 from a lateral surface of the sealing resin part 70 opposite to the first main terminal 32 and the second main terminal 42.

In the semiconductor device 100, as described above, the first terminal member 30, the semiconductor chip 10, the terminal part 20, and the second terminal member 40 are arranged and stacked in this order in the Z direction. Further, the semiconductor chip 10, the terminal part 20, the first terminal member 30, the second terminal member 40, the signal terminal 50, and the wire 60 form an integrated body. This integrated body is covered with the sealing resin part 70 in a state where a part of each of the terminals 32, 42, 50 and the heat radiating surfaces are exposed.

The sealing resin part 70 is made of, for example, an epoxy resin. The sealing resin part 70 has a substantially rectangular shape in a plan view, and has the front surface orthogonal to the Z direction, the back surface opposite to the front surface, and the lateral surface connecting the front surface and the back surface. In the semiconductor device 100, the semiconductor chip 10 and respective connection portions are protected by the sealing resin part 70.

Next, the semiconductor chip 10 will be described. The semiconductor chip 10 includes a semiconductor substrate 11, gate wirings 12, 13, the electrodes 14, an insulating portion 15, and the like. The semiconductor substrate 11 is made mainly of silicon, silicon carbide, or the like. That is, as the semiconductor substrate 11, a silicon semiconductor or a wide bandgap semiconductor can be used. In the present embodiment, as an example, the semiconductor substrate 11 is made of silicon carbide as a main component and has a MOSFET as the power transistor. Alternatively, the semiconductor substrate 11 can be made of a wide bandgap semiconductor other than the silicon carbide.

Further, the semiconductor substrate 11 is formed with the power transistor such as an insulated gate bipolar transistor (IGBT) or a MOSFET. The power transistor can be regarded as a heat generating element since the power transistor generates heat when in operation. As shown in FIG. 2, the semiconductor chip 10 has a substantially rectangular shape in a plan view.

The MOSFET has a so-called vertical structure so that a current flows in the Z direction. The semiconductor substrate 11 has the electrode 14 as a source electrode on one surface, that is, on the front surface in the Z direction, and a drain electrode on the back surface opposite to the front surface having the source electrode. The drain electrode is formed almost entirely over the back surface.

As shown in FIG. 2, the semiconductor substrate 11 has a plurality of pads 16 on the front surface. The pads 16 are signal electrodes. The semiconductor chip 10 has the plurality of pads 16. The plurality of pads 16 are arranged side by side in the X direction, at an end portion opposite to a formation region of the electrode 14 in the Y direction. For example, one of the pads 16 is connected to a gate wiring for a gate electrode.

As shown in FIG. 3, the semiconductor substrate 11 has a plurality of active regions a1 to a4 in which elements such as MOSFETs are formed, and inactive regions na1 to na5 in which an element is not formed.

Each of the active regions a1 to a4 is formed with an area to which the electrode 14 is connected. The active regions a1 to a4 can be said to be regions in which the drain current flows and operation regions of the MOSFET. In the present embodiment, as an example, the plurality of active regions a1 to a4, such as four active regions, are formed in the X direction. That is, the semiconductor substrate 11 is formed with the plurality of active regions a1 to a4 arranged in the X direction, and each of the active regions a1 to a4 extends in the Y direction. The active regions a1 to a4 are arranged at intervals, that is, spaced apart from each other in the X direction.

In the present embodiment, the four active regions a1 to a4 are formed, as an example. However, the present disclosure is not limited to such an example, and the number of the active regions is not limited to four. For example, the semiconductor substrate 11 may be formed with two active regions, or five or more active regions.

The gate wirings, which will be described later, are arranged above the inactive regions na1 to na5. The inactive regions na1 to na5 are disposed in between the active regions a1 to a4, and on an outer periphery of the active regions a1 to a4. A voltage-resistant structure such as a guard ring is formed in the inactive regions na1 to na5. The inactive region disposed between the active regions will be referred to as an inter-inactive portion, and the inactive region disposed on the periphery of the active regions will be referred to as an outer peripheral inactive portion.

A second inactive region na2 is formed between a first active region a1 and a second active region a2. A third inactive region na3 is formed between the second active region a2 and a third active region a3. A fourth inactive region na4 is formed between the third active region a3 and a fourth active region a4. The first inactive region na1 and the fifth inactive region na5 are formed on the outer periphery of the active regions a1 to a4.

In FIG. 3, the symbols na1 and na5 are assigned to the inactive regions formed on the outer periphery of the active regions a1 to a4. However, the first inactive region na1 and the fifth inactive region na5 can be regarded as a continuous inactive region surrounding the outer peripheries of the active regions a1 to a4. Therefore, in the present embodiment, it can be said that four inactive regions na1 to na5 are formed. However, the present disclosure is not limited to this example, and it is sufficient that the inactive regions are formed with the number according to the number of active regions.

As shown in FIGS. 2 and 3, the gate wirings 12 and 13 are formed above the inactive regions na1 to na5. Each of the gate wirings 12 and 13 is a wiring for applying a voltage to the gate of the MOSFET. The gate wirings 12 and 13 are electrically connected to the pad 16. Each of the gate wirings 12 and 13 is covered with an insulating portion 15 as an insulating layer.

The semiconductor chip 10 is formed with the first gate wiring 12 and the second gate wiring 13, as the gate wirings. The first gate wiring 12 has a polysilicon layer 12a as a polysilicon wiring and an aluminum layer 12b as a metal wiring stacked on the polysilicon layer 12a. On the other hand, the second gate wiring 13 has the polysilicon layer as the polysilicon wiring, but does not have a metal wiring such as an aluminum layer. That is, the second gate wiring 13 can be regarded as the wiring obtained by removing the aluminum layer 12b from the first gate wiring 12. Therefore, the thickness of the second gate wiring 13 is smaller in the Z direction than that of the first gate wiring 12.

The first gate wiring 12 is formed above the first inactive region na1, the third inactive region na3, and the fifth inactive region na5. In other words, the first gate wiring 12 is formed so as to surround the electrodes 14. On the other hand, the second gate wirings 13 are formed above the second inactive region na2 and the fourth inactive region na4.

The electrodes 14 correspond to surface electrodes. As shown in FIGS. 2 and 3, the electrodes 14 are arranged on the front surface side of the active regions a1 to a4 and are electrically connected to the active regions a1 to a4. In the present embodiment, the semiconductor chip 10 has the two electrodes 14, one being electrically connected to the first active region a1 and the second active region a2 and the other being electrically connected to the third active region a3 and the fourth active region a4.

Figure 4:
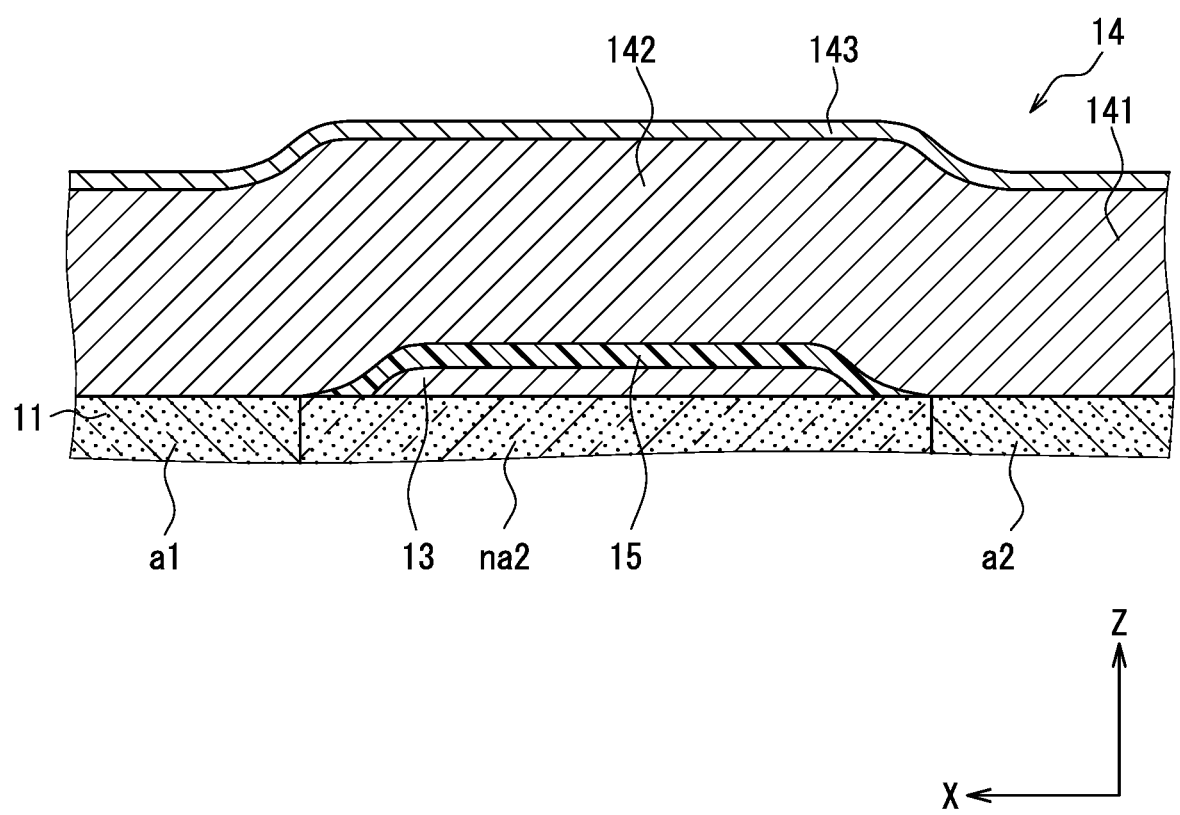
FIG. 4 is an enlarged view of a part IV in FIG. 3.

Further, each of the electrodes 14 is arranged so as to straddle the second gate wiring 13 via the insulating portion 15. As shown in FIG. 4, the electrode 14 includes two electrode-connecting portions 141 and a bridging portion 142 connecting between the two electrode-connecting portions 141. The electrode-connecting portions 141 are connected to the active regions a1 and a2 or a3 and a4. The bridging portion 142 is arranged above the second gate wiring 13. The electrode-connecting portions 141 and the bridging portion 142 are continuously provided. That is, the electrode 14 is an electrode layer in which the electrode-connecting portions 141 and the bridging portion 142 are continuously formed.

The bridging portion 142 is arranged above the second gate wiring 13 via the insulating portion 15. As described above, since the electrode 14 is arranged also above the second gate wiring 13 and the insulating portion 15, the electrode 14 has a partially raised shape by the amount of thicknesses of the second gate wiring 13 and the insulating portion 15. The second gate wiring 13 is thus arranged so as to be held by the electrode 14. It can be said that the second gate wiring 13 is surrounded by or covered with the semiconductor substrate 11 and the electrode 14.

In FIG. 4, in order to distinguish the active regions a1 and a2 from the inactive region na2, the hatching is different only on the surface of the semiconductor substrate 11.

However, the active regions a1 and a2 and the inactive regions na2 are not formed on the surface of the semiconductor substrate 11.

In the semiconductor device 100, as described above, the electrode 14 is arranged so as to straddle the second gate wiring 13. Therefore, the semiconductor device 100 can restrict the electrode 14 from sliding above the second gate wiring 13, as compared with the case where the electrode 14 is divided above the gate wiring. As such, the semiconductor device 100 can suppress the electrode 14 from being short-circuited with the second gate wiring 13.

Further, differently from the first gate wiring 12, the second gate wiring 13 has the polysilicon wiring but does not have the metal wiring. Therefore, the semiconductor device 100 can suppress the electrode 14 from being short-circuited with the second gate wiring 13 even if the electrode 14 slides. That is, the semiconductor device 100 can suppress the electrode 14 from short-circuiting with the second gate wiring 13 even if the electrode 14 slides in the X direction. As such, the semiconductor device 100 can improve the electrical performance.

Further, as described above, the second connecting portion 82 is provided on the surface of the electrode 14. In this case, the surface of the electrode 14 may be subjected to a surface treatment for improving the bonding force with the second connecting portion 82. The surface treatment includes an antioxidant treatment or a treatment for improving the wettability of the solder. In the present embodiment, a plating treatment is performed as an example of the surface treatment. Therefore, the electrode 14 has a plating layer 143 on the surface. In this case, the semiconductor device 100 can improve the connection state between the semiconductor chip 10 and the terminal part 20, as compared with the case where the surface treatment is not applied.

In the present embodiment, the terminal part 20 and a part of the first gate wiring 12 are exemplarily provided so as to face each other. As shown in FIG. 2, the first gate wiring 12 that is arranged between the electrodes 14 is located in the facing region to face the terminal part 20. Alternatively, the terminal part 20 may be arranged at a position without facing the first gate wiring 12. That is, the first gate wiring 12 may not be provided in the facing region of the terminal part 20, but may be provided only on the periphery of the facing region of the terminal part 20.

The configurations of the first gate wiring 12 and the second gate wiring 13 are not limited to the examples described above. The first gate wiring 12 is a gate wiring provided on the front surface side of the inactive region, and may be at least arranged around the electrode 14. That is, the first gate wiring 12 may not be provided at a position (facing region) facing the electrode 14. On the other hand, the second gate wiring 13 is a gate wiring provided on the front surface side of the inactive region, and may be provided at a position facing the electrode 14. That is, the second gate wiring 13 may be provided between the semiconductor substrate 11 and the electrode 14.

The embodiment of the present disclosure has been described hereinabove. However, the present disclosure is not limited to the above embodiment. Various modifications may be made without departing from the scope and spirit of the present disclosure. Hereinafter, first to third modifications will be described as modifications of the present disclosure. The embodiment described above and the first to third modifications can be implemented independently. However, the embodiment described above and the first to third modifications can be suitably combined to implement the present disclosure. The present disclosure is not limited to combinations disclosed herein, but may be implemented in various other combinations.

First Modification

Figure 5:
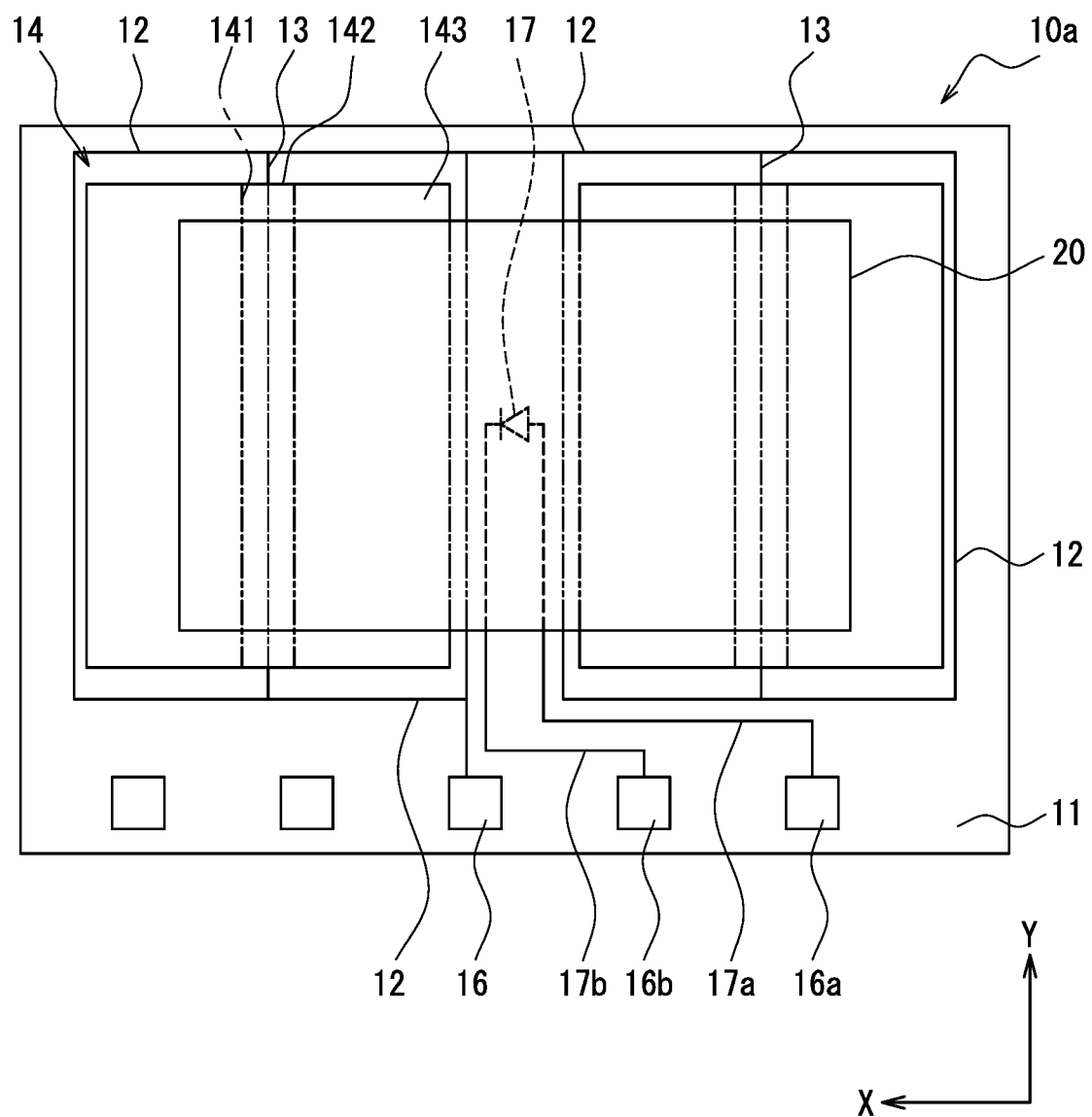
FIG. 5 is a plan view of a semiconductor chip for showing a schematic configuration according to a first modification.

In a semiconductor device of the first modification, the configuration of a semiconductor chip 10a is different from that of the semiconductor chip 10 of the embodiment described above. As shown in FIG. 5, the semiconductor chip 10a is provided with a temperature sensitive diode 17. Further, as an example, the temperature sensitive diode 17 is provided in the facing region of the terminal part 20. The temperature sensitive diode 17 is provided to detect the temperature of the semiconductor substrate 11.

The temperature sensitive diode 17 is provided in a nonconductive region. In other words, the temperature sensitive diode 17 is provided in the inactive region. The temperature sensitive diode 17 has an anode electrically connected to a first pad 16a via a first wiring 17a, and a cathode electrically connected to a second pad 16b via a second wiring 17b.

The semiconductor device of the first modification can achieve the similar effects to those of the semiconductor device 100 of the embodiment described above. Further, the semiconductor device of the first modification can output the temperature of the semiconductor substrate 11.

Second Modification

Figure 6:
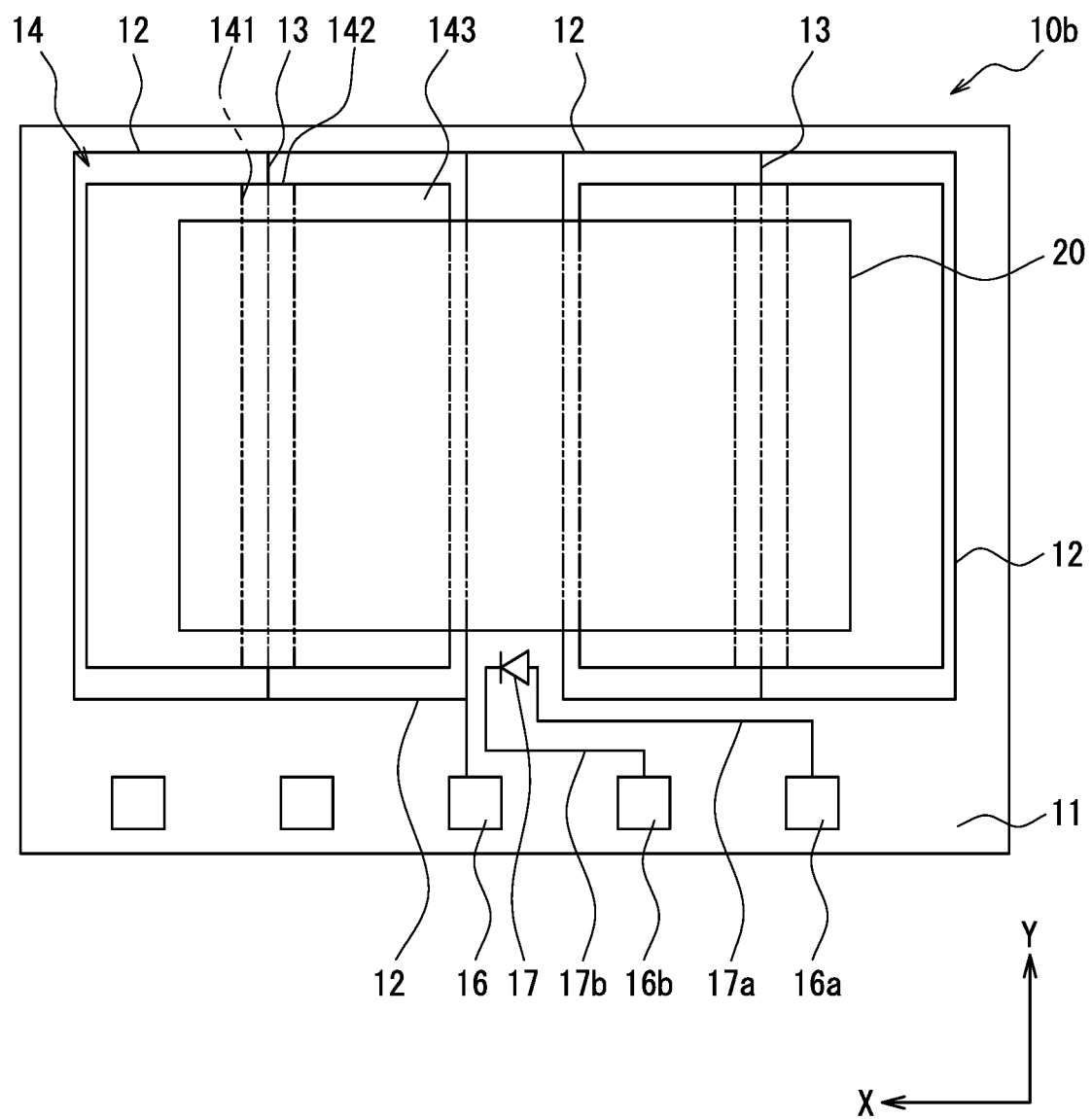
FIG. 6 is a plan view of a semiconductor chip for showing a schematic configuration according to a second modification.

In a semiconductor device of the second modification, the configuration of a semiconductor chip 10b is different from that of the semiconductor chip 10a of the first modification. As shown in FIG. 6, the semiconductor chip 10b is provided with a temperature sensitive diode 17 at a position without facing the terminal part 20. That is, the semiconductor chip 10b has the temperature sensitive diode 17 on a periphery of the facing region of the terminal part 20. The semiconductor device of the second modification can achieve the similar effects to those of the semiconductor device of the first modification.

Third Modification

Figure 7:
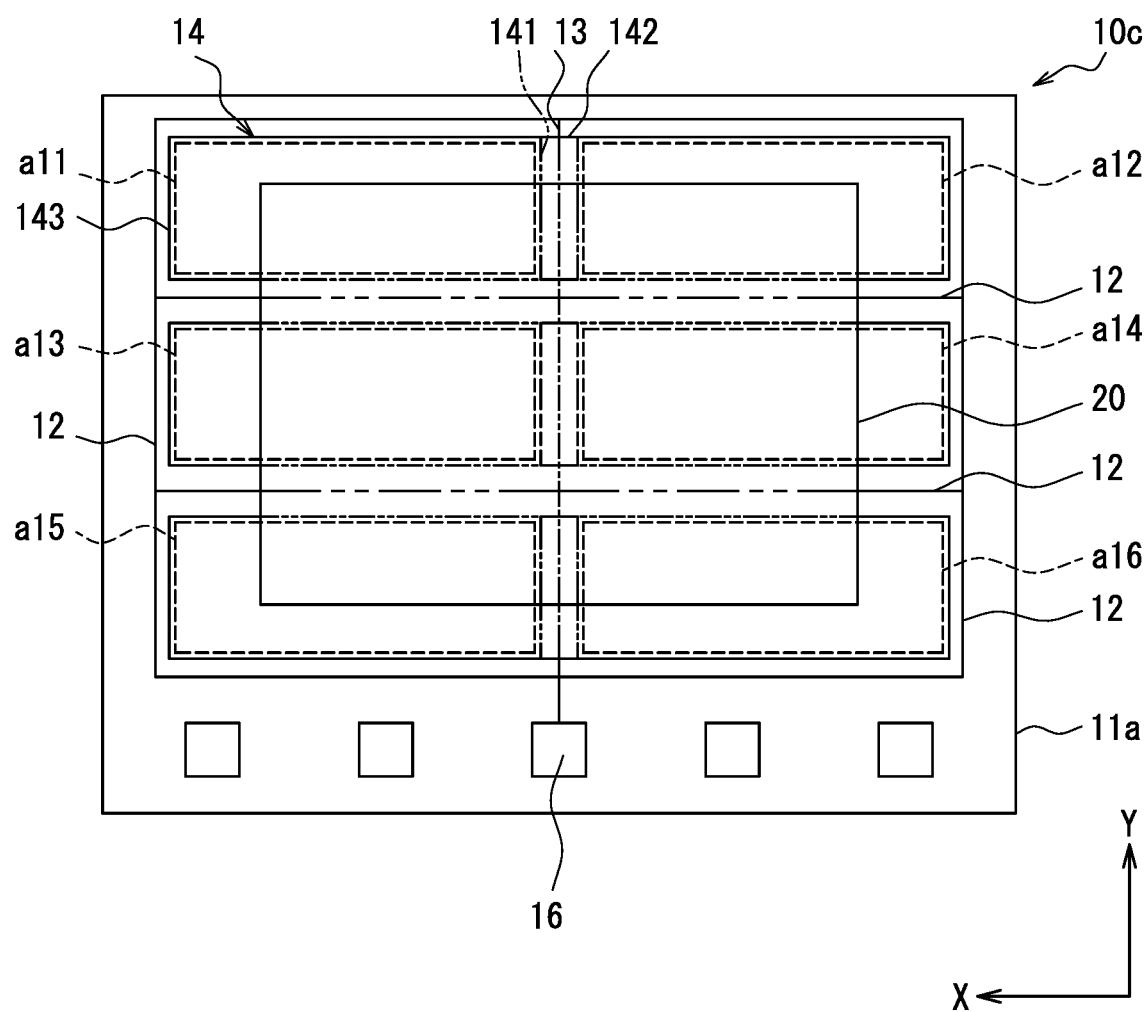
FIG. 7 is a plan view of a semiconductor chip for showing a schematic configuration according to a third modification.

In a semiconductor device of the third modification, the configuration of a semiconductor substrate 11a is different from that of the semiconductor substrate 11 of the embodiment described above. As shown in FIG. 7, a semiconductor chip 10c has the semiconductor substrate 11a. The semiconductor substrate 11a is formed with a first active region a11, a second active region a12, a third active region a13, a fourth active region a14, a fifth active region a15, and a sixth active region a16. The semiconductor substrate 11a has inactive regions in between and on a periphery of the first to sixth active regions a11 to a16.

In the semiconductor substrate 11a, the first active region a11, the third active region a13, and the fifth active region a15 are arranged side by side in the Y direction. Likewise, the second active region a12, the fourth active region a14, and the sixth active region a16 are arranged side by side in the Y direction. Further, in the semiconductor substrate 11a, the first active region a11 and the second active region a12 are arranged side by side in the X direction. Likewise, in the semiconductor substrate 11a, the third active region a13 and the fourth active region a14 are arranged side by side in the X direction. Further, the fifth active region a15 and the sixth active region a16 are arranged side by side in the X direction.

The electrodes 14 are provided at three locations. A first electrode 14 is arranged so as to extend over the first active region a11 and the second active region a12. A second electrode 14 is arranged so as to extend over the third active region a13 and the fourth active region a14. A third electrode 14 is arranged to as to extend over the fifth active region a15 and the sixth active region a16.

In the following description, the first active region a11, the third active region a13, and the fifth active region a15, which are arranged side by side in the Y direction, are collectively referred to as a first active row. Similarly, the second active region a12, the fourth active region a14, and the sixth active region a16 are collectively referred to as a second active row. Further, the first active region a11 and the second active region a12 are collectively referred to as a first active line, and the third active region a13 and the fourth active region a14 are collectively referred to as a second active line. Similarly, the fifth active region a15 and the sixth active region a16 are collectively referred to as a third active line.

The first gate wiring 12 is arranged on the periphery of the first to sixth active regions a11 to a16, and on the inactive regions formed in between the first active line and the second active line, and in between the second active line and the third active line. On the other hand, the second gate wiring 13 is arranged on the inactive region formed in between the first active row and the second active row.

In the semiconductor chip 10c, the second gate wiring 13 may be used instead of the first gate wiring 12 disposed in between the first active line and the second active line and in between the second active line and the third active line. As a result, the semiconductor device can suppress the electrode 14 from being short-circuited with the second gate wiring 13 even if the electrode 14 slides not only in the X direction but also in the Y direction.

The semiconductor device of the third modification can achieve the similar effects to those of the semiconductor device 100 of the embodiment described above. In a case where the electrode 14 is divided above the inactive region, the possibility that the electrode 14 and the gate wirings are short-circuited increases with an increase in the number of division of the active regions per the same size of the semiconductor substrate. However, since the semiconductor device of the third modification is configured as described above, a short circuit can be suppressed even if the number of divisions of the active region is large.

What is claimed is:

1. A semiconductor device comprising:
   a semiconductor chip having a front surface and a back surface opposite to the front surface;
   a first conductive member disposed adjacent to the back surface of the semiconductor chip; and
   a second conductive member disposed adjacent to the front surface of the semiconductor chip, wherein
   the semiconductor chip includes:
   a semiconductor substrate having a plurality of active regions formed with elements, and an inactive region not formed with an element, the inactive region including an inter-inactive portion disposed between at least two active regions and an outer peripheral inactive portion disposed on an outer periphery of the at least two active regions;
   a surface electrode disposed to continuously extend above the at least two active regions and the inter-inactive portion; and
   a plurality of gate wirings disposed above the inactive region adjacent to the front surface, the plurality of gate wirings including a first gate wiring disposed on an outer periphery of the surface electrode, and a second gate electrode disposed at a position facing the surface electrode, and
   the first gate wiring includes a polysilicon wiring and a metal wiring, and
   the second gate wiring includes a polysilicon wiring without having a metal wiring.

2. The semiconductor device according to claim 1, wherein
   the first conductive member includes a first heat radiating part radiating heat generated from the semiconductor chip, and
   the second conductive member includes a second heat radiating part radiating the heat generated from the semiconductor chip.

3. The semiconductor device according to claim 2, wherein
   the second conductive member includes a terminal part that is disposed between the second heat radiating part and the semiconductor chip to electrically connect the surface electrode and the second heat radiating part, and
   a coefficient of linear expansion of the terminal part is a value between that of the first and second heat radiating parts and that of the semiconductor substrate.

4. The semiconductor device according to claim 3, wherein
   the semiconductor chip includes a temperature sensitive diode at a position without facing the terminal part.

5. The semiconductor device according to claim 3, wherein
   the terminal part is disposed at a position without facing the first gate wiring.

6. The semiconductor device according to claim 1, wherein
   the semiconductor chip has a temperature sensitive diode in a nonconductive region.

7. The semiconductor device according to claim 1, wherein
   the semiconductor substrate is made of a silicon semiconductor.

8. The semiconductor device according to claim 1, wherein
   the semiconductor substrate is made of a wide bandgap semiconductor.

9. The semiconductor device according to claim 1, wherein
   the surface electrode is provided with an electrically conductive connection member on a surface thereof, and
   the surface of the surface electrode is bonded with the electrically conductive connection member with a predetermined bonding strength caused by a surface treatment.

10. The semiconductor device according to claim 1, wherein
    the surface electrode includes a plurality of electrode-connection portion and a bridging portion connecting between at least two electrode-connection portions,
    the electrode-connection portions are disposed on the at least two active regions that are adjacent to each other through the second gate wiring and connected to the at least two active regions, and
    the bridging portion is disposed above the inter-inactive portion via the second gate wiring and an insulating portion.

11. A semiconductor device comprising:
a semiconductor chip having a front surface and a back surface opposite to the front surface;
a first conductive member disposed adjacent to the back surface of the semiconductor chip; and
a second conductive member disposed adjacent to the front surface of the semiconductor chip, wherein
the semiconductor chip includes:
a semiconductor substrate having a plurality of active regions formed with elements, and an inactive region not formed with an element, the inactive region including an inter-inactive portion disposed between at least two active regions and an outer peripheral inactive portion disposed on an outer periphery of the at least two active regions;
a surface electrode disposed to continuously extend above the at least two active regions and the inter-inactive portion; and
a plurality of gate wirings disposed above the inactive region adjacent to the front surface, the plurality of gate wirings including a first gate wiring disposed on an outer periphery of the surface electrode, and a second gate electrode disposed at a position facing the surface electrode,
the first conductive member includes a first heat radiating part radiating heat generated from the semiconductor chip,
the second conductive member includes a second heat radiating part radiating the heat generated from the semiconductor chip, and a terminal part that is disposed between the second heat radiating part and the semiconductor chip to electrically connect the surface electrode and the second heat radiating part, and
a coefficient of linear expansion of the terminal part is a value between that of the first and second heat radiating parts and that of the semiconductor substrate.

12. The semiconductor device according to claim 11, wherein
the semiconductor chip includes a temperature sensitive diode at a position without facing the terminal part.

13. The semiconductor device according to claim 11, wherein
the terminal part is disposed at a position without facing the first gate wiring.

14. The semiconductor device according to claim 11, wherein
the semiconductor chip has a temperature sensitive diode in a nonconductive region.

15. The semiconductor device according to claim 11, wherein
the semiconductor substrate is made of a silicon semiconductor.

16. The semiconductor device according to claim 11, wherein
the semiconductor substrate is made of a wide bandgap semiconductor.

17. The semiconductor device according to claim 11, wherein
the surface electrode is provided with an electrically conductive connection member on a surface thereof, and
the surface of the surface electrode is bonded with the electrically conductive connection member with a predetermined bonding strength caused by a surface treatment.

18. The semiconductor device according to claim 11, wherein
the surface electrode includes a plurality of electrode-connection portion and a bridging portion connecting between at least two electrode-connection portions,
the electrode-connection portions are disposed on the at least two active regions that are adjacent to each other through the second gate wiring and connected to the at least two active regions, and
the bridging portion is disposed above the inter-inactive portion via the second gate wiring and an insulating portion.

* * * * *